350-1.7 SR
XR 3,895,147

United States Patent [19]

[11] 3,895,147
[45] July 15, 1975

Ahn et al.

[54] FABRICATION MASK USING DIVALENT RARE EARTH ELEMENT

[75] Inventors: Kie Y. Ahn, San Jose, Calif.; Frank P. Laming, Poughkeepsie, N.Y.

[73] Assignee: International Business Machines Corporation, Armonk, N.Y.

[22] Filed: Dec. 27, 1971

[21] Appl. No.: 212,258

[52] U.S. Cl. .................... 428/63; 96/36.2; 96/38.3; 350/1; 350/314; 428/67; 428/156; 428/195

[51] Int. Cl. .................... G02b 5/20

[58] Field of Search .......... 117/5.5, 38, 201, 203, 117/211, 33.3, 212; 156/8, 13, 17; 252/62.51, 62.56, 62.57; 96/38.3, 36.2; 355/123, 36.3, 125, 133; 95/1; 350/1; 161/2

[56] References Cited

UNITED STATES PATENTS

| | | | |
|---|---|---|---|
| 3,110,102 | 11/1963 | Pfefferkorn | 29/490 |
| 3,418,036 | 12/1968 | Holtzberg et al. | 252/62.51 |
| 3,488,286 | 1/1970 | Holtzberg et al. | 252/62.51 |
| 3,508,982 | 4/1970 | Shearin | 156/17 |
| 3,567,308 | 3/1971 | Ahn et al. | 350/166 |
| 3,591,465 | 7/1971 | McKelvey | 156/13 |
| 3,607,679 | 9/1971 | Melroy | 204/15 |
| 3,661,436 | 5/1972 | Horwath et al. | 117/33.3 |
| 3,681,227 | 8/1972 | Szupillo | 204/192 |

FOREIGN PATENTS OR APPLICATIONS

| | | |
|---|---|---|
| 2,023,215 | 11/1969 | France |
| 6,714,609 | 4/1969 | Netherlands |

OTHER PUBLICATIONS

Ahn et al., "Prep. & Properties EuS Films," IEEE Transactions on Mag., Sept. 1971, pp. 394–396.

Antorov et al., "Optical Properties of Rare Earth Orthoferrites," Mosk. Eng. Inst. Fiz. Tverd. Tela., 1970, 12(6), pp. 1724–1728.

Ahn, "Increase in the Cuzie temperature in EuO films by Fe doping," Applied Phys. Ltrs. pp. 347–349, 15 Oct. 1970.

*Primary Examiner*—George F. Lesmes
*Assistant Examiner*—R. J. Roche
*Attorney, Agent, or Firm*—Jackson E. Stanland

[57] ABSTRACT

A mask for the manufacture of semiconductor and various small components. Rare earth elements capable of existing in the divalent state ($Eu^{2+}$, $Sm^{2+}$, $Yb^{2+}$) are combined with group VI elements (O, S, Se, Te) to provide the masking material. Trivalent rare earth elements, such as $Eu^{3+}$, are also suitable if proper dopants are present. An example is $Eu_2O_3$ doped with $Fe_2O_3$. This masking material is harder than the components being manufactured and is opaque to the wavelength used in photoresist techniques while being transparent to visible wavelengths over broad thickness ranges. The mask can comprise a patterned layer on a substrate or patterned bulk crystals having regions of different thickness. Substrates such as soda-lime glass, sapphire, quartz, etc. are suitable. The masking material can be deposited as large area films having good uniformity and good optical properties. The material is readily etched but is not attacked by materials used in photoresist processing. Its reflectivity is very low, thereby providing easy alignment and good image definition during use.

6 Claims, 13 Drawing Figures

3895147
OR IN 428/63

FABRICATION MASK USING DIVALENT RARE EARTH ELEMENT

BACKGROUND OF THE INVENTION

1. Field of the Invention

This invention relates to a fabrication mask for the production of small components, and more particularly to masks which are wear resistant and capable of visual alignment during fabrication of the small components.

2. Description of the Prior Art

In the fabrication of small components, and particularly semiconductor components, masks are extensively used. For instance, such masks enable the definition of precise patterns of very small size on a semiconductor wafer. However, it is at present very difficult to produce micron and submicron components with existing mask techniques.

In many semiconductor processes, a wafer of semiconductor material is coated with a layer of photoresist, after which a mask is brought into contact with the photoresist layer. Light of a particular wavelength (usually ultraviolet) will pass through the mask openings and will expose the photoresist in those portions uncovered by the mask. After development, the wafer is etched in the developed locations. If desired, further process steps, such as diffusion or evaporation of another material, are then done.

In the sample process above, it is very important that the mask be properly aligned with patterns already on the wafer and that it define the very small dimensions required. Further, the mask must be used numerous times and therefore must be wear resistant. During the fabrication processes, the mask must be continually moved. Therefore, real time alignment is required in order to obtain high device yield.

Existing masks, such as chromium-on-glass, cadmium sulfide, and photographic emulsion masks, do not meet these requirements. For instance, the chromium masks are not transparent to visible light, and alignment problems are difficult. Usually, markers are used to position the masks during the fabrication steps, although this leads to inaccuracies and a resultant low fabrication yield.

Chromium-on-glass masks can be damaged by surface imperfections on the underlying semiconductor. For instance, the spikes which are formed during epitaxial deposition are large and may seriously damage the mask when it is placed in contact with the semiconductor surface. Since the mask is generally much more expensive than the underying semiconductor wafers, this damage represents a serious and costly problem.

Even if transparent masks are used, some of the presently known masks of this type are comprised of very soft material, such as photographic emulsions and cadmium sulfide. These masks are easily damaged by surface imperfections and have very short lifetimes.

Copending application Ser. No. 51,237, filed 6/30/70 in the name of R. S. Horwath et al and assigned to the present assignee (now U.S. Pat. No. 3,661,436) describes a semitransparent mask using multicomponent oxides and fluorides, such as spinels, perovskites, and garnets. Although these materials are suitable as transparent masks, some difficulties arise in etching these materials and in fabricating large area films of these materials. Also, the defect densities which result are sometimes large.

Accordingly, it is a primary object of this invention to provide a mask which is suitable for the fabrication of very small devices and which can be deposited as a large area film having good optical properties.

It is another object of this invention to provide a fabrication mask which can be visually aligned during fabrication processes and can be made using standard techniques.

It is still another object of this invention to provide fabrication masks which are extremely hard and which have good uniformity of thickness and material properties.

It is a further object of this invention to provide a mask for the fabrication of small components which is readily etched by known etchants.

It is another object of this invention to provide a mask for the fabrication of small components which has very low reflectivity and which is not attacked by the solutions used in the component manufacturing process in which the mask is employed.

BRIEF SUMMARY OF THE INVENTION

This mask can be used in the manufacture of micron and sub-micron components and is particularly suited to the manufacture of semiconductor components. The masking material is a divalent rare earth element ($Sm^{2+}$, $Eu^{2+}$, and $Yb^{2+}$) which is combined with a group VI element (O, S, Se, Te). A trivalent rare earth element, such as $Eu^{3+}$, is also suitable if proper dopants are present. An example is $Eu_2O_3$ doped with $Fe_2O_3$. Depending upon the thickness of the masking material, a semitransparent or non-semitransparent mask is provided. In the first case, the mask is transparent to visible radiation and opaque to the radiation used in the component manufacturing processes, while in the second case, the mask is not transparent to visible radiation. Three embodiments are provided for a patterned masking material comprising a divalent rare earth element and a group VI element.

In the first embodiment, the masking material is deposited as a thin film on a substrate, and is patterned to provide the mask. In this case, the film of masking material is provided with regions of lesser thickness which will be transparent to both visible radiation and the radiation used to expose photoresist in component manufacturing processes in which the mask is employed. For instance, the regions of lesser thickness will be transparent to ultraviolet radiation which is generally used to expose photoresist layers.

In a second embodiment, the masking material is provided as patterned deposits in one surface of a substrate. The thickness of the deposits is determined in accordance with the radiation to be used in component fabrication processes in which the mask is employed. For instance, the deposits of masking material are generally selected to be opaque to the wavelength of the radiation used to expose photoresist layers. In addition, the thickness of the deposit of masking material is generally chosen so that these deposits will be transparent to visible radiation, which is generally the case for the substrate. In this manner, a semitransparent mask suitable for visual alignment will be provided.

In a third embodiment, the mask is comprised of a bulk crystal of the masking material, which is not supported by a substrate. To provide the patterns having different transmission to radiation, this bulk crystal has regions of varying thickness. The regions of lesser thickness are chosen to be transparent to the radiation used in the component manufacturing processes in which the mask is employed. For instance, these regions of lesser thickness will generally be chosen to be transparent to ultraviolet radiation which is conventionally used to expose photoresist layers. The regions of lesser thickness will provide transmission of visible radiation to allow visual alignment of the mask, although this latter requirement is not necessary if visual alignment is not desired.

In accordance with further teaching of this invention, a dopant can be provided in the masking material to alter its radiation transmission properties. A suitable dopant is iron, which will shift the absorption of the masking material. This will enable different thicknesses to be used.

The foregoing and other objects, features, and advantages of the invention will be apparent from the following more particular description of the preferred embodiments of the invention as illustrated in the accompanying drawings.

DESCRIPTION OF THE PREFERRED EMBODIMENTS

FIGS. 1A–1D illustrate one method for forming a mask according to this invention. The final mask configuration comprises a thin film of masking material located on a substrate. There are holes in the masking material which create a patterned masking layer. That is, the final structure is similar to that shown in FIG. 3.

Figure 1A:
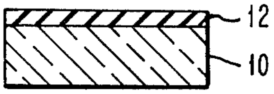
FIGS. 1A–1D illustrate a method for making a mask whose final structure is similar to that of FIG. 3.

In FIG. 1A a substrate 10 is coated on one surface by a thin film of masking material 12. The substrate material is not critical and materials such as soda-lime glasses, sapphire, quartz, etc. are suitable. The substrate thickness is generally about 0.06 inch which is standard practice in the industry. Usually, the substrate will be transparent to both visible radiation and radiation used to expose photoresist layers used in component manufacturing processes in which the mask is employed. This means that generally the substrate material will be transparent to near ultraviolet radiation, since this is the radiation most commonly used to expose photoresist layers. The masking material in layer 12 is opaque to ultraviolet radiation and transparent to visible radiation, if a semitransparent mask is desired. For this purpose, layer 12 can be from approximately 1000 angstroms to 4000 angstroms in thickness if a filter is used in conjunction with the mask to insure that the masking material will be opaque to the radiation used to expose photoresist layers. The lower limit of 1000 angstroms is generally chosen by the condition that the masking material not have an excessive amount of pinholes.

If a filter is not used and a semitransparent mask is desired, the thickness of layer 12 can be from about 4000 angstroms to about 6000 angstroms. If the thickness is less than about 4000 angstroms, the optical density of layer 12 will be low in the region of wavelengths in which most photoresists are sensitive. The optical density is a measure of the contrast ratio for light transmitted through the mask area and the clear area. It is desirable that in the optical window defining the wavelength range of sensitivity of the photoresist that the optical density be at least equal to one (preferably greater than two) so that there will be a significant difference between the transmission of ultraviolet radiation through the masked areas and the unmasked areas. At the high end of this thickness range (6000 angstroms), thicknesses above this amount generally are not desirable since the mask will then be opaque to visible light and the visual alignment feature will be lost.

If it is not necessary to provide a semitransparent mask, thicknesses of layer 12 can be greater than 6000 angstroms. This will mean that regions having masking material greater than 6000 angstroms will be opaque to both ultraviolet radiation and visible radiation.

The masking material is a combination of a divalent rare earth element ($Sm^{2+}$, $Eu^{2+}$, $Yb^{2+}$) combined with an element from group VI of the periodic table. These are the elements oxygen, sulfur, selenium, and tellurium. For instance, the masking material might be comprised of a film of EuO, EuS, SmO, YbO, SmSe, or YbS, etc. Of these possible materials, it is generally more easy to make the oxide, followed by the sulfide, followed by the selenide, followed by the telluride. For instance, when using Eu, it is generally preferable to use masking materials comprising EuO or EuS.

Generally, the rare earth elements having valences of 3+ are not suitable since their absorption band is narrow. Since broad band radiation is used for exposure of photoresist layers, masking materials using trivalent rare earths would not provide a sufficiently broad absorption band. However, the use of proper dopants will enable use of trivalent rare earth elements. For instance, $Eu^{3+}$ is suitable if in a $Eu_2O_3$ film doped with $Fe_2O_3$, as will be explained later.

Masking layer 12 can be applied to substrate 10 in a number of ways including sputtering and evaporation. Conventional sputtering using powdered or mixed targets is suitable. It is also possible to use spray techniques or spinning techniques to provide layer 12. In general, any ceramic deposition technique for growing continuous films can be used.

Since the masking material 12 is etchable, a very thick layer can be grown and then etched to the desired thickness. For instance, EuO is etchable using very dilute etchants, such as 1/200 M acetic acid. Another etchant is 5% aqueous citric acid. The best etchant for EuO is 1 percent–10 percent nitric acid in 100 percent glycerol. For this latter etch, 3–5 percent nitric acid is preferred.

Figure 1B:
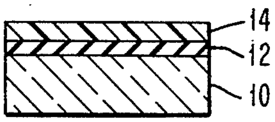

In FIG. 1B, a thin layer of photoresist 14 is deposited on masking layer 12. The thickness of the photoresist layer is not critical. It is only important that the full thickness of layer 14 be exposable with radiation, most generally ultraviolet radiation.

In contrast with other masking materials such as iron oxide, the masking materials of the present invention can be used with a variety of photoresist materials such as those made by the Eastman Kodak Company and by the Shipley Company. Both positive and negative photoresists can be used. Surprisingly, even though these masking materials are easily etched by dilute acids, they are not attacked at all by the solutions used in the photoresist development and stripping processes. Consequently, any type of photoresists can be used with these masking materials.

Figure 1D:
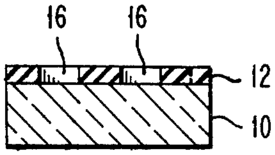
Figure 2D:
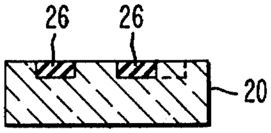

Photoresist layer 14 is selectively exposed with ultraviolet light and then the exposed regions are dissolved using a suitable solvent. Five percent $HNO_3$ in glycerol is then used to etch masking layer 12 and the resulting mask is that of FIG. 1C. After removal of photoresist 14 and masking layer 12 in selected regions 16, the remaining unexposed photoresist is removed leaving the final mask structure as shown in FIG. 1D. This final structure consists of substrate 10 and a masking layer 12 which has selectively etched holes 16 therein. This structure is shown in a perspective view in FIG. 3. In that figure, it is readily apparent that the mask has a pattern of geometrically arranged openings 16 in the masking layer 12. Although the openings 16 are shown as extending to the top surface of substrate 10, it should be understood that they need not extend to the substrate 10. For instance, a thin layer of masking material of about 500 angstroms can be left in the selected regions 16.

Figure 2A:
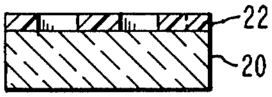
FIGS. 2A–2D illustrate a method for making a mask whose final structure is similar to that of FIG. 4.
Figure 2B:
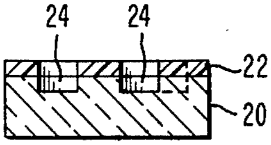
Figure 1C:
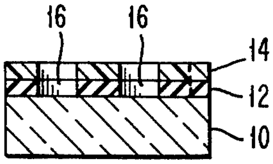

Another suitable method for making a mask is shown in FIGS. 2A–2B. In this method, openings will be provided in a substrate into which is deposited the masking material. This structure (FIG. 4) differs from that of FIG. 3 in which an external layer of masking material 12 has etched openings 16 in it. Of course, the same considerations apply with respect to thickness of masking material buried in the substrate as were applied for the thickness of layer 12 in the mask of FIG. 3.

In FIG. 2A, the substrate 20 has a pattern of photoresist 22 on its top surface. This photoresist pattern is produced in conventional ways, as by uniformly coating the surface of substrate 20 with a photoresist layer and then developing selected portions. The selected portions are then dissolved away leaving a pattern similar to that shown in FIG. 2A.

Figure 2C:
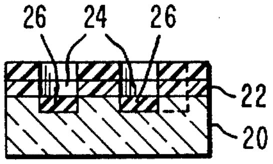

In FIGS. 2A–2D, the substrate materials and dimensions are similar to those used in the embodiment of FIGS. 1A–1D, and FIG. 3. Of course, the masking materials used are also the same as were described previously. In FIG. 2B, regions 24 are etched into the exposed surface portions of the substrate 20. Masking material 26 is then deposited into these etched regions 24 and onto photoresist 22 (FIG. 2C). After this, the photoresist (and its overlying masking material) is dissolved away, leaving the structure of FIG. 2D. As was mentioned previously, the considerations used for choosing the thickness of the masking material 26 are the same as those applied for the mask of FIG. 3. For instance, by choosing the proper thickness of masking material 26 it is possible to provide a semitransparent mask which is opaque to ultraviolet radiation and transparent to visible radiation.

Figure 4:
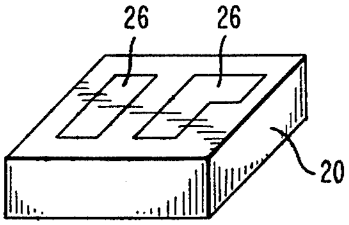
FIG. 4 is an illustration of a mask in which the masking material is located in various regions in the substrate surface.

A possible final configuration for masks produced by the method shown in FIGS. 2A–2D is illustrated in FIG. 4. Here, the substrate 20 has buried masking material 26 which forms a geometric pattern. This mask can be placed onto a surface and used for component fabrication wherever photoresist techniques are employed.

Figure 3:
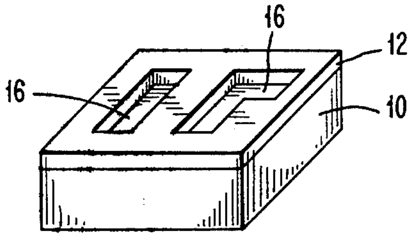
FIG. 3 is an illustration of a mask in which a thin film of masking material has etched holes therein.

The masks of FIGS. 3 and 4 can be fabricated by techniques other than those described previously. For instance, an alternate technique is to use an electron beam to fabricate a master mask. Further masks are made from this master mask by techniques such as those described with reference to FIGS. 1A–1D and FIGS. 2A–2D. This results in a mask with very high resolution.

Another suitable technique for making a mask is projection masking. Here, a large mask is initially manufactured and then is reduced onto photoresists in order to obtain successfully smaller masks. That is, each mask is imaged onto photoresists through a reducing lens in order to provide successively smaller masks. EuO and the other materials described herein are easily adapted for projection masking and electron beam exposure techniques which are conventionally well known. By the use of these techniques, it is possible to obtain sub-micron structures with good edge definitions. Such masks in turn are used to make fine structures on semiconductors, such as silicon devices. Since these materials are harder than silicon and other commonly used semiconductors, the masks will have very long lifetimes. For instance, a mask of EuO on sapphire is very hard and durable. This is economically important, since the cost of the mask is sufficiently greater than that of the underlying semiconductor wafers.

In defining the geometric pattern of the mask, conventional techniques such as projection masking can be used. Since the resolution obtainable depends upon the wavelengths of the light used to expose the photoresist, electron beam fabrication techniques will produce the smallest mask patterns. Many photoresists can be exposed by electron beam techniques and, if these photoresists are used in making the masks, it will be possible to produce sub-micron geometric patterns.

Projection masking is another technique for producing the mask geometries. In this technique, an image of the desired pattern is projected onto the photoresist covered masking layer by means of a high resolution lens. If a high quality lens is used, an entire one inch wafer can be exposed, giving patterns as small as 2.5 microns. If a high quality microscopic lens is used, patterns as small as 0.5 microns can be produced on an area of approximately 0.5×0.5 millimeters.

Figure 5:
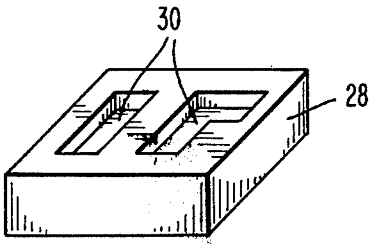
FIG. 5 is an illustration of a mask comprising a bulk crystal having regions of varying thickness therein.

FIG. 5 is an embodiment of a fabrication mask in which a bulk crystal 28 has patterned grooves 30 therein which provide regions of crystal 28 having lesser thickness. The thick portions of crystal 28 are opaque to the radiation used in photoresist processing whereas the thinner regions of crystal 28 (formed by grooves 30) are transparent to this radiation. For instance, a thin region of approximately 500 angstroms or less is transparent to ultraviolet radiation. Therefore, grooves 30 are etched deeply enough into crystal 28 so that the thin regions below these grooves have a thickness of 500 anstroms or less in order to be transparent to ultraviolet radiation.

A fabrication mask in accordance with FIG. 5 has an advantage that it is very formable and can be made to conform to the substrate wafer topology. However, these crystals are somewhat fragile and deep etching into them may cause some spreading of the grooves 30.

This will hinder their use in high resolution fabrication processes.

Figure 6:
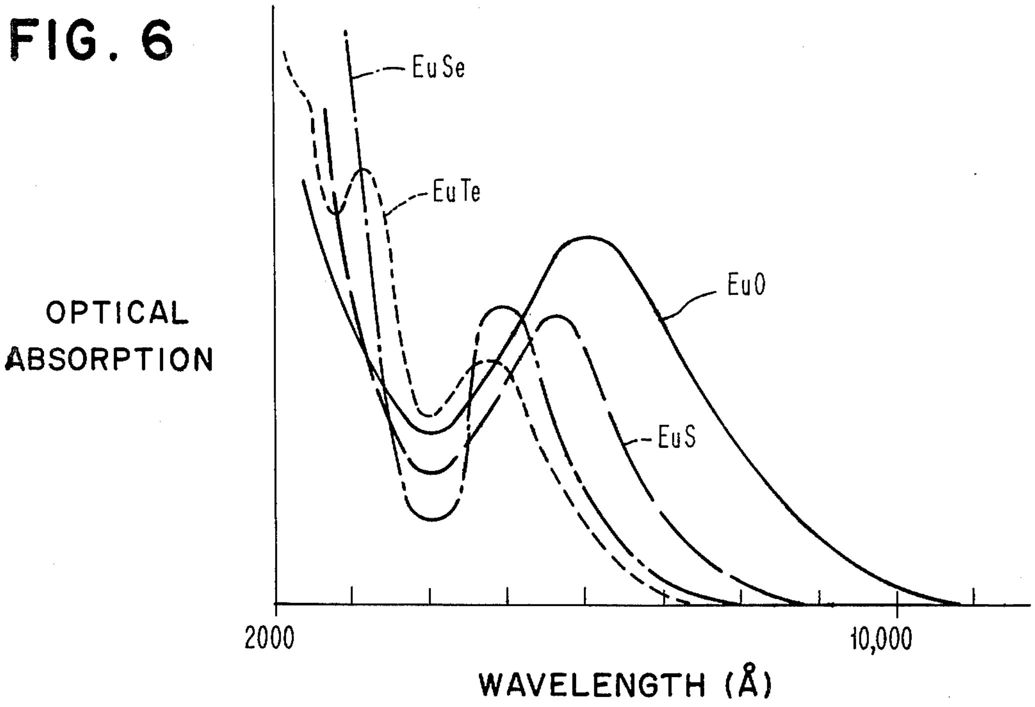
FIG. 6 is a plot of optical absorption versus wavelength for some of the masking materials of the present invention.

FIG. 6 is a plot of optical absorption versus wavelength for the europium series of masking materials. From this plot it is readily evident that these films can be made with thicknesses to provide opacity in the ultraviolet range and transparency in the visible range so as to provide semitransparent masks.

DOPED MASKING MATERIAL

The absorption of the masking material can be varied by additions of impurities to this material. This has the advantage that thinner films can be used since the absorption of the films can be increased.

As an example of a doped film, thin films of $Eu_2O_3$ ($Eu^{3+}$) are transparent in the wavelength region of 0.3–3.5 microns. When this material has a small amount of $Fe_2O_3$, the transparency is modified and its optical absorption characteristics are suitable for applications in semitransparent masks. Thus, a trivalent rare earth element can be used in the masking material. For example, films prepared with doped $Fe_2O_3$ have a sharp absorption edge starting at around 4000 angstroms, which extends into the ultraviolet range. For a 2000 angstrom film, the absorbance for a wavelength of approximately 3600 angstroms is 2.0, as can be seen by referring to FIG. 7, which plots the optical absorption versus wavelength for this film.

Figure 7:
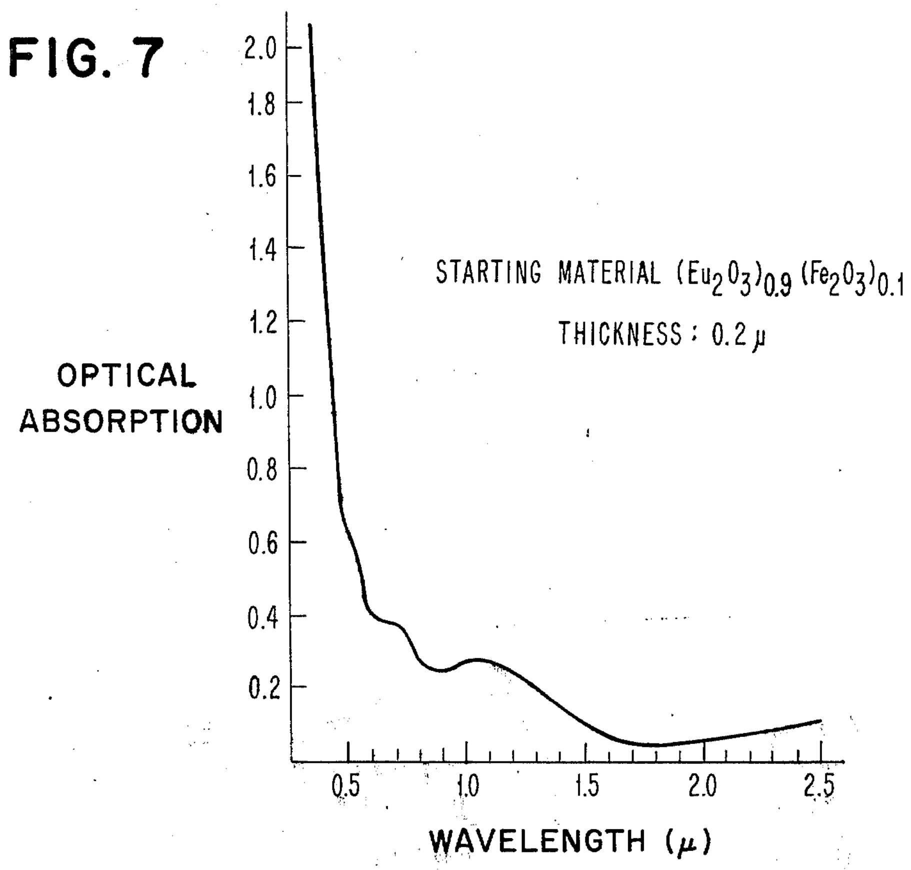
FIG. 7 is a plot of optical absorption versus wavelength for a masking material which has iron dopants therein.

To prepare a film such as that whose absorption is illustrated in FIG. 7, vacuum evaporation is suitable. A mixed oxide slug of $(Eu_2O_3)_{0.9}(Fe_2O_3)_{0.1}$ is evaporated using an electron beam gun. An initial pressure of $2\times10^{-7}$ Torr. is used and the films are deposited onto heated glass or fused quartz substrates having a temperature of approximately 380°C. A typical evaporation rate is 6–7 angstroms/second. The starting material is hot-pressed after mixing the two oxides to provide a final density of about 90 percent.

Films produced in this way are ideally suited for use with mercury vapor lamps and photoresist techniques. Good deposition of uniform films over a large area is provided and there is good reproducibility between films. These films are mechanically durable, can be handled easily, and are readily etched using dilute $HNO_3$. The chemical stability of the films is excellent and and they can be deposited on glassy or metallic substrates.

As an alternative method for producing iron doped europium oxide films, codeposition of $Eu_2O_3$ and Fe in an ultrahigh vacuum evaporator is suitable. A weight ratio of 6:1, respectively, during evaporation of these materials results in a doped $Eu_2O_3$ film which is semitransparent. That is, it is opaque to ultraviolet radiation and transparent to visible radiation. The optical absorption edge of the doped film starts at 0.5 micron for a 2240 angstrom film.

The films can be deposited at a rate of approximately 10 angstroms per second onto a heated (100°C) substrate using a pressure range $5\times10^{-8} - 6\times10^{-7}$ Torr.

These films have low reflectivity and they are easily aligned visually. They are reproducible and the optical absorption can be tailored by control of the Fe concentration. As with the previous films, dilute $HNO_3$ is a suitable etchant and the films have good durability and good adhesion to the substrate.

What has been described is a mask using materials which have not heretofore been suggested for use in this manner. These masks combine the features of high hardness, a capability for continual visual alignment, and compatability with present day photoresist techniques to produce a mask which is superior to those presently used. The materials used are the divalent rare earth elements combined with the group VI elements of the periodic table and doped trivalent rare earth materials combined with group VI elements. If desired, doping of these films can be provided to shift the optical absorption properties of the masking material to allow use over a wide range of operating conditions. A particularly suitable technology for use of these masks is semiconductor processing.

What is claimed is:

1. A mask suitable for use in the fabrication of components by processes utilizing radiation, comprising:
   - a supporting medium transparent to said radiation for supporting a masking material thereon,
   - a masking material located on said supporting medium and having a geometric pattern useful in said fabrication process, said pattern defining first areas of said masking material which are transparent to said radiation and second areas of said mask which are substantially opaque to said radiation wherein said masking layer is substantially comprised of a divalent rare earth element selected from the group consisting of $Sm^{2+}$, $Eu^{2+}$, and $Yb^{2+}$ combined with an element selected from the group consisting of O, S, Se and Te.

2. The mask of claim 1, where the thickness of said masking material is between about 1000 angstroms and 6000 angstroms.

3. The mask of claim 1, where the thickness of said masking material is greater than 6000 angstroms.

4. The mask of claim 1, where said masking material is a layer supported by said medium having holes etched in it which extend substantially to said supporting medium.

5. The mask of claim 1, wherein said masking material is buried in regions in said supporting medium.

6. A mask suitable for use in the fabrication of components by processes utilizing electromagnetic radiation, comprising:
   - a supporting medium transparent to said radiation for supporting a masking material thereon,
   - a masking material substantially opaque to said radiation located on said supporting medium and having a geometric pattern useful in said fabrication process, said pattern defining areas of said masking material which are transparent to said radiation, wherein said masking material consists of $Eu^{3+}$ combined with an element selected from the group consisting of O, S, Se and Te, said masking material further including Fe in an amount sufficient to make said masking material substantially opaque to said radiation.

* * * * *